(12) United States Patent
Vincent

(10) Patent No.: US 6,674,172 B2
(45) Date of Patent: Jan. 6, 2004

(54) FLIP-CHIP PACKAGE WITH UNDERFILL HAVING LOW DENSITY FILLER

(75) Inventor: Michael B. Vincent, Chenango Forks, NY (US)

(73) Assignee: International Business Machines Corporation, Armonk ( * ) Notice: Subject to any disclaimer, the term of this patent is extended or adjusted under 35 U.S.C. 154(b) by 111 days.

(21) Appl. No.: 09/850,922

(22) Filed: May 8, 2001

(65) Prior Publication Data

US 2002/0167077 A1 Nov. 14, 2002

(51) Int. Cl.[7] .......................... H01L 23/48; H01L 23/52; H01L 29/40
(52) U.S. Cl. ........................................ 257/777; 257/783
(58) Field of Search ................... 257/777, 783

(56) References Cited

U.S. PATENT DOCUMENTS

| | | | |
|---|---|---|---|
| 3,933,712 A | * | 1/1976 | Vanaglash, Jr. ............. 523/219 |
| 4,681,718 A | | 7/1987 | Oldham |
| 5,128,746 A | | 7/1992 | Pennisi et al. |
| 5,171,769 A | * | 12/1992 | Bull et al. .................... 523/447 |
| 5,527,838 A | | 6/1996 | Afzali-Ardakani et al. |
| 5,641,997 A | * | 6/1997 | Ohta et al. ................... 257/788 |
| 5,706,175 A | | 1/1998 | Takei |
| 5,880,530 A | * | 3/1999 | Mashimoto et al. ........ 257/783 |
| 5,907,190 A | | 5/1999 | Ishikawa et al. |
| 5,981,313 A | | 11/1999 | Tanaka |
| 6,030,854 A | * | 2/2000 | Mashimoto et al. ........ 438/106 |
| 6,049,038 A | | 4/2000 | Suzuki |
| 6,121,689 A | * | 9/2000 | Capote et al. ............... 257/783 |
| 6,211,320 B1 | * | 4/2001 | Dershem et al. ............ 524/553 |
| 6,225,704 B1 | * | 5/2001 | Sumita et al. ............... 257/778 |
| 6,373,142 B1 | * | 4/2002 | Hoang ......................... 257/783 |
| 6,383,660 B2 | * | 5/2002 | Igarashi ....................... 257/789 |
| 2002/0142174 A1 | * | 10/2002 | Kropp et al. ................ 428/447 |

* cited by examiner

Primary Examiner—David E. Graybill
(74) Attorney, Agent, or Firm—Schmeiser, Olsen & Watts; Arthur J. Samodovitz

(57) ABSTRACT

A method and structure for solderably coupling a semiconductor chip to a substrate, with an underfill between the chip and the substrate. In forming the structure, underfill material is dispensed upon a conductive pad on the substrate. The underfill material comprises a resin and a filler. The filler density is less than the resin density. The chip is moved toward the substrate and into the underfill until a solder member coupled to the chip is proximate the conductive pad. The structure is heated, resulting in soldering the solder member to the conductive pad and in curing the underfill. Filler particles move through the resin and toward the chip, resulting in an increased filler concentration near the solder member, and a reduced underfill coefficient of thermal expansion (CTE) near the solder member that is close to the CTE of the solder member.

11 Claims, 6 Drawing Sheets

FLIP-CHIP PACKAGE WITH UNDERFILL HAVING LOW DENSITY FILLER

BACKGROUND OF THE INVENTION

1. Technical Field

The present invention relates to a method and structure for coupling a semiconductor chip to a substrate by use of solder joints, and more particularly to a method and structure for forming an underfill between the semiconductor chip and the substrate, wherein the underfill encapsulates the solder joints.

2. Related Art

A structure of a chip joined to a substrate by solder joints may have underfill material that encapsulates the solder joints and fills a space between the chip and the substrate. With the underfill present, however, the structural integrity of the solder joints are at risk during thermal cycling operations because of tensile stress on the solder joints and shear stress on the solder joints and at the underfill-chip interface.

The tensile stress on the solder joints is due to a difference in coefficient of thermal expansion (CTE) between the chip and the substrate in the vicinity of the solder joints, which causes flexing of the chip and consequent solder joint fatigue leading to loss of contact between chip and the substrate at solder joint locations. The chip CTE is typically about 2 to 5 parts per million (ppm) per ° C., and the substrate CTE is typically significantly higher (e.g., about 18 to 20 ppm/° C.).

The shear stress on the solder joints may be caused by CTE mismatch between the solder joints and the underfill, which may result in solder joint cracking. The CTE of solder joints is typically about 26 to 30 ppm/° C., while the CTE of the underfill is typically much higher (e.g., about 70 to 80 ppm/° C.).

The shear stress at the underfill-chip interface may be caused by CTE mismatch between the solder joints and the underfill. The shear stress at the underfill-chip interface may result in delamination of the underfill at the underfill-chip interface, causing crack formation at the solder joints.

Thus, there is a need for a method and structure which, during thermal cycling operations, protects the structural integrity of the solder joints that join the chip to a substrate, where an underfill material encapsulates the solder joints and fills the space between the chip and the substrate.

SUMMARY OF THE INVENTION

The present invention provides an electronic structure, comprising:
- a substrate;
- an electronic device coupled to the substrate by an electrically conductive interconnect; and
- an underfill disposed in a space between the electronic device and the substrate, wherein an upper portion of the underfill is adjacent to the electronic device, wherein a lower portion of the underfill is adjacent to the substrate, wherein the underfill encapsulates the electrically conductive interconnect, wherein the underfill comprises a resin and a filler, wherein the density of the filler is less than the density of the resin, and wherein the weight percent concentration of the filler in the underfill is higher in the upper portion of the underfill than in the lower portion of the underfill.

The present invention provides a method for forming an electronic structure, comprising:
- providing a substrate with a conductive pad coupled to the substrate;
- providing an electronic device with a solder member coupled to the electronic device;
- soldering the solder member to the conductive pad to form an electrically conductive interconnect that couples the electronic device to the substrate, wherein the solder member is transformed into a solder portion of the electrically conductive interconnect;
- dispensing an underfill in a space between the electronic device and the substrate, wherein an upper portion of the underfill is adjacent to the electronic device, wherein a lower portion of the underfill is adjacent to the substrate, wherein the underfill encapsulates the electrically conductive interconnect, wherein the underfill comprises a resin and a filler, and wherein the density of the filler is less than the density of the resin; and
- heating the underfill after which a weight percent concentration of the filler in the underfill is higher in the upper portion of the underfill than in the lower portion of the underfill.

The present invention provides a method for forming an electronic structure, comprising:
- providing a substrate with conductive pads coupled to the substrate;
- providing an electronic device with a solder members coupled to the electronic device;
- dispensing an underfill on the substrate and over the conductive pads, wherein the underfill comprises a resin and a filler, and wherein the density of the filler is less than the density of the resin;
- moving the electronic device toward the substrate and into the underfill such that the solder members of the electronic device are aligned over corresponding conductive pads of the substrate, said moving occurring until the solder members are proximate the corresponding conductive pads; and
- heating the electronic device resulting in soldering the solder members to the corresponding conductive pads to form electrically conductive interconnects that couple the electronic device to the substrate, wherein the solder members are each transformed into a solder portion of the electrically conductive interconnect, wherein after the heating a weight percent concentration of the filler in the underfill is higher in an upper portion of the underfill that is adjacent to the electronic device than in a lower portion of the underfill that is adjacent to the substrate.

The present invention provides a method and structure which, during thermal cycling operations, protects the structural integrity of the solder joints that join the chip to a substrate, where an underfill material encapsulates the solder joints and fills the space between the chip and the substrate.

DETAILED DESCRIPTION OF THE INVENTION

Figure 1:
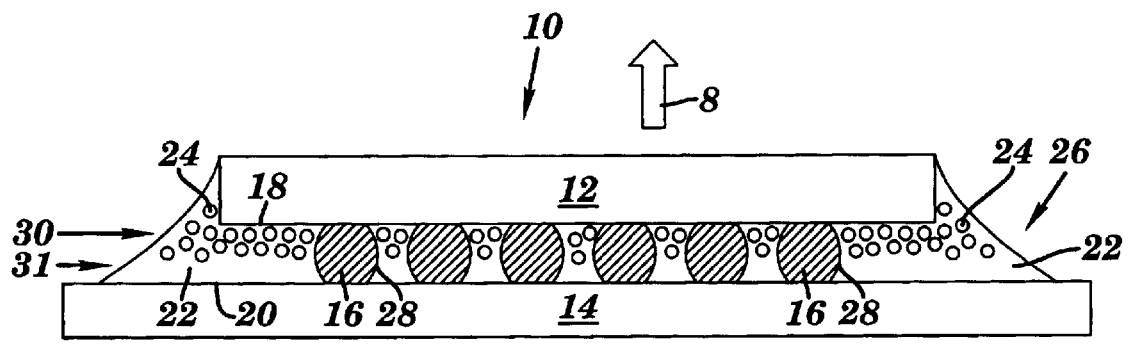
FIG. 1 depicts a front cross-sectional view of an electronic structure, in accordance with embodiments of the present invention.

FIG. 1 illustrates a front cross-sectional view of an electronic structure 10, in accordance with embodiments of the present invention. The electronic structure 10 comprises an electronic device 12 solderably coupled to a substrate 14. Said solderable coupling is effectuated by electrically conductive interconnects 16 extending between a surface 18 of the electronic device 12 and a surface 20 of the substrate 14, said surface 18 facing said surface 20. The electronic device 12 may include, inter alia, a semiconductor chip. The substrate 14 may include, inter alia, a chip carrier such as a ceramic chip carrier or an organic chip carrier. The electrically conductive interconnects 16 may include, inter alia, a controlled collapse chip connection (C4) solder ball soldered to a conductive pad (e.g., a copper pad), wherein the C4 solder ball is coupled to the electronic device 12, and wherein the conductive pad is coupled to the substrate 14.

The space between the surface 18 of the electronic device 12 and the surface 20 of the substrate 14 includes an underfill 26, wherein the underfill 26 encapsulates the interconnects 16. The coefficient of thermal expansion (CTE) of the underfill 26 should not substantially differ from the CTE of the interconnects 16 (i.e., of solder joints within the interconnects 16), especially near the outer surface 28 of the interconnects 16, so as to avoid differential thermal expansion between the underfill 26 and the interconnects 16 during thermal transients (e.g., during thermal cycling operations). Such differential thermal expansion threatens the structural integrity of solder portions within the interconnects 16. Said solder portions have a CTE typically between about 26 ppm/° C. and about 30 ppm/° C.

The underfill 26 includes a resin 22 and a filler 24. The underfill 26 has an "upper portion" 30 and a "lower portion" 31. The upper portion 30 is adjacent to the electronic device 12 at the surface 18 and includes a mixture of the resin 22 and a filler 24. The lower portion 31 is adjacent to the substrate 14 at the surface 20, and includes the resin 22. There is little or no filler 24 in the lower portion 31. The resin 22 includes any underfill resin material as is known to a person of ordinary skill in the art.

The filler 24 includes a material having a lower density than the density of the resin 22. For example, given a resin 22 having a density of about 1.1 to 1.2 g/cm$^3$, the material of the filler 24 may include, inter alia, a borosilicate glass having a density of about 0.4 g/cm$^3$, or a ceramic material that includes alumina or silica with a density of 1.1 g/cm$^3$. Thus with a resin 22 having a density of about 1.1 to 1.2 g/cm$^3$ and a filler having a density of about 0.4 g/cm$^3$ (e.g., borosilicate glass), the resin density exceeds the filler density by a factor of about 3. The low density of the filler 24 (i.e., low relative to the density of the resin 22) results from inclusion of hollow spheres of trapped gas (e.g., nitrogen) within the filler 24, wherein the trapped gas is formed during processing relating to forming the filler 24. During said processing of the filler 24 material, solvent within the filler material becomes gaseous during a heating step and the resultant gas becomes trapped within the filler, resulting in formation of the hollow spheres. The trapped gas cannot escape because the walls surrounding the gas are sufficiently thick to enable the walls to withstand the pressure of the trapped gas. Additionally, the filler 24 is encapsulated by the resin 22, which further prevents the trapped gas from escaping. The low density of the filler 24 relative to the density of the resin 22 facilitates the aforementioned relatively higher concentration of the filler 24 near the electronic device 12 and at solder portions of the interconnects 16 (which are located predominantly in the upper portion 30 of the underfill 26) as will be explained infra in a discussion of methods of forming the electronic structure 10. Another characteristic of the filler 24 is that a filler 24 particle dimension does not exceed the distance between the surface 18 of the electronic device 12 and the surface 20 of the substrate 14.

As stated supra, the underfill 26 should have a CTE that does not substantially differ from the CTE of the solder portions of the interconnects 16, particularly at locations proximate the solder portions. The resin 22 by itself has a CTE typically between about 70 ppm/° C. and about 80 ppm/° C., which is substantially higher than the CTE of about 26 to 30 ppm/° C. of the solder portions of the interconnects 16. In contrast, the filler 24 has a relatively low CTE. For example, filler 24 materials of borosilicate glass and silica have a CTE of about 3.2 ppm/° C. and about 0.5 ppm/° C., respectively. Thus, rather than have the underfill 26 include only resin 22 in the upper portion 30 of the underfill 26, the underfill 26 should have a sufficient concentration by weight of the filler 24 in the upper portion 30, so that the CTE of the upper portion 30 will not substantially differ from the CTE of the solder portions of the interconnects 16, in order to prevent a CTE mismatch between the underfill 26 and the solder portions of the interconnects 16 from weakening or damaging the structural integrity of solder portions of the interconnects 16 during thermal cycling or other thermal transients. A useful range of the CTE of the upper portion 30 (i.e., the composite underfill) is about 20 ppm/° C. to about 50 ppm/° C. if the CTE of the solder portions of the interconnects 16 is about 28 ppm/° C. More generally, a useful range of the CTE of the upper portion 30 is about −8 ppm/° C. to about +22 ppm/° C. relative to the CTE of the solder portions of the interconnects 16.

The present invention includes a "fast-flow" method, as well as a "no-flow" method, of forming the electronic structure 10.

Figure 2:
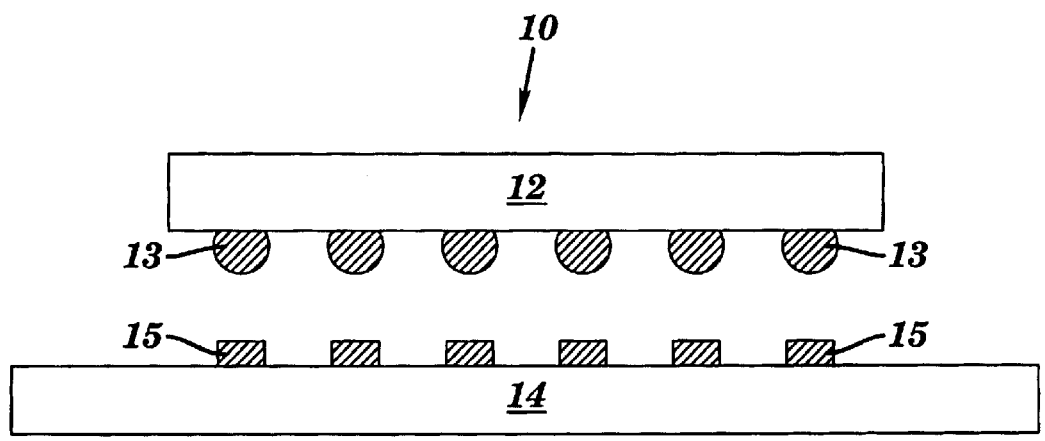
FIG. 2 depicts an initial step in forming the electronic structure of FIG. 1 by the fast-flow method, in accordance with embodiments of the present invention, wherein the electronic structure includes a substrate having conductive pads and an electronic device having solder members.

FIG. 2 illustrates an initial step in forming the electronic structure 10 of FIG. 1 by the fast-flow method, in accordance with embodiments of the present invention. The electronic structure 10 in the initial step of FIG. 2 includes the substrate 14 and the electronic device 12, previously discussed supra in conjunction with FIG. 1. In FIG. 2, conductive pads 15 are coupled to the substrate 14, and solder members 13 are coupled to the electronic device 12. The solder members 13 may include, inter alia, C4 solder balls. The solder members 13 are aligned with corresponding conductive pads 15.

Figure 3:
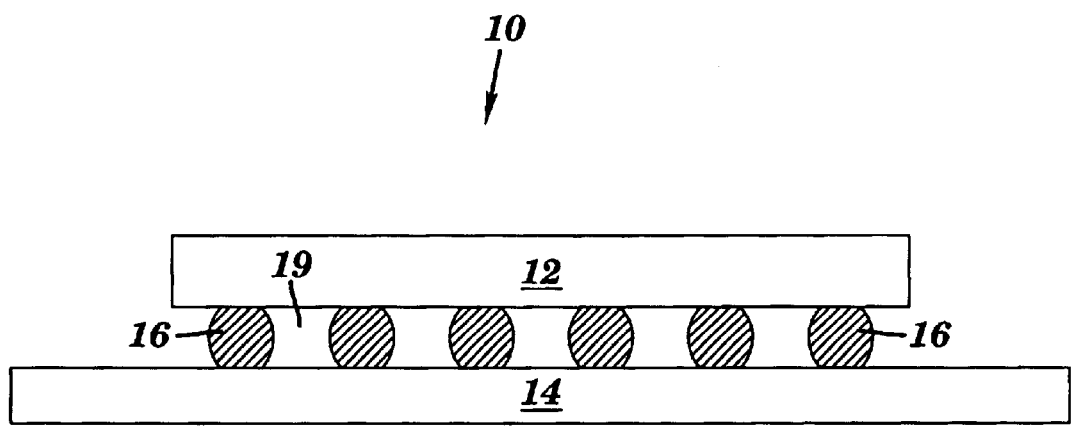
FIG. 3 depicts FIG. 2 after the solder members have been soldered to the conductive pads to form electrically conductive interconnects.

FIG. 3 illustrates FIG. 2 after the solder members 13 have been soldered to the conductive pads 15 to form electrically conductive interconnects 16 (also illustrated supra in FIG. 1), by any method known to a person of ordinary skill in the art. For example in FIG. 2, solder paste may be applied to the conductive pads 15, followed by reflowing the solder paste at a temperature below a melting temperature of the solder members 13, such that the reflowed solder paste, after being cooled, causes the solder members 13 to be solderably attached to the conductive pads 15. As another example, the solder members 13 may be reflowed to solderably attach the electronic device 12 to the conductive pads 15. Returning to FIG. 3, after the electrically conductive interconnects 16 have been formed, a space 19 remains between the electronic device 12 and the substrate 14.

Figure 4:
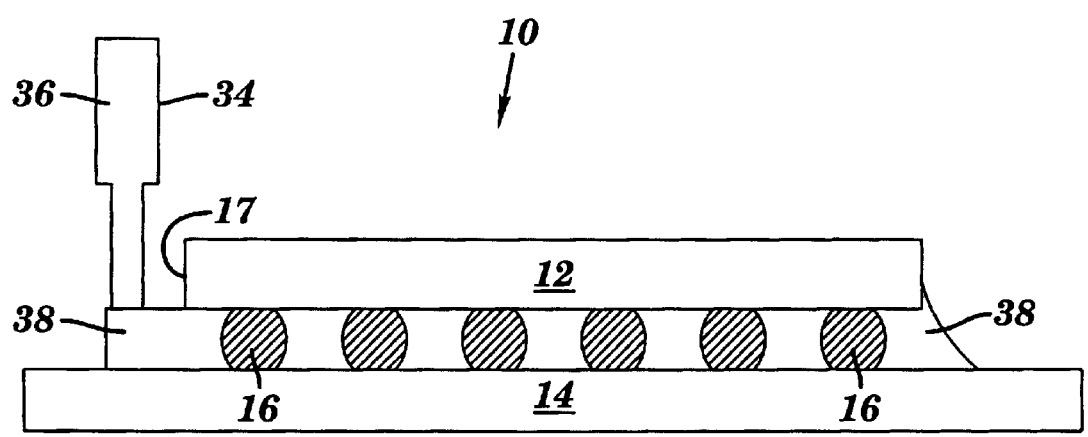
FIG. 4 depicts FIG. 3 with a tube such that the tube dispenses underfill material between the electronic device and the substrate.

FIG. 4 illustrates FIG. 3 with a tube 34 having a plunger such that the tube 34 dispenses underfill material 36 between the electronic device 12 and the substrate 14. The tube 34 is positioned proximate a side 17 of the electronic device 12. The underfill material 36 in the tube 34 becomes an underfill 38 after being so dispensed. The underfill material 36 is drawn into the space 19 (see FIG. 3) between the electronic device 12 and the substrate 14 by capillary action. In FIG. 4, the underfill material 36 encapsulates the electrically conductive interconnects 16. The underfill material 36 includes a mixture of resin and filler, which subsequently becomes the resin 22 and filler 24, respectively, of FIG. 1. The resin and filler may include any resin and filler, respectively that has been described supra in conjunction with FIG. 1. While in the tube 34, the resin and filler are pressurized and distributed approximately homogeneously. The resin and filler may be homogeneously distributed by any method known to one of ordinary skill in the art, such as by, inter alia, using special additives to make the mixture homogeneous, by surface treating the filler particles to make the filler particles more compatible with the resin so as to suspend the filler particles in the resin, or by adding one or more thixotropes to help suspend the filler particles in the resin. Another known technique for creating the homogeneous mixture of filler and resin is to use a high-shear method of mixing the filler and resin.

FIG. 1, described supra, illustrates FIG. 4 after the underfill has been cured by any method known to one of ordinary skill in the art, such as by, inter alia, placing the electronic structure 10 in a curing oven and heating the electronic structure 10 to a temperature and time appropriate for a specific resin system to provide a 100% or near-100% cross-linked resin. As a result of the curing, the underfill 38 of FIG. 4 becomes the underfill 26 of FIG. 1. Although the underfill material 36 is homogeneous when dispensed from the tube 34 in FIG. 4, the underfill 26 of FIG. 1 shows the filler 24 particles having a substantially higher concentration in the upper portion 30 of the underfill 26 than in the lower portion 31 of the underfill 26. The higher concentration of the filler 24 particles in the upper portion 30 is due to the low density of the filler 24 relative to the density of the resin 22, which causes the filler 24 particles to move upward in the direction 8. The heating associated with the curing of the underfill lowers the viscosity of the resin 22, which allows the filler 24 particles to move more easily through the resin 22 in the upward motion of the filler 24 particles. In FIG. 1, the solder portion of the interconnect 16 is predominantly in the upper portion 30 of the underfill 26 inasmuch as the solder portion is derived from the solder member 13 (see FIG. 2). Thus in FIG. 1, the higher concentration of the filler 24 particles in the upper portion 30 is where the solder portion is predominantly located, which enables the resulting lower CTE in the upper portion 30 to be closely matched with the CTE of the solder portions so as to protect the structural integrity of interconnects 16 during thermal cycling operations. Additionally, the lower CTE in the upper portion 30 reduces the CTE mismatch between the underfill 26 and the electronic device 12.

Figure 5:
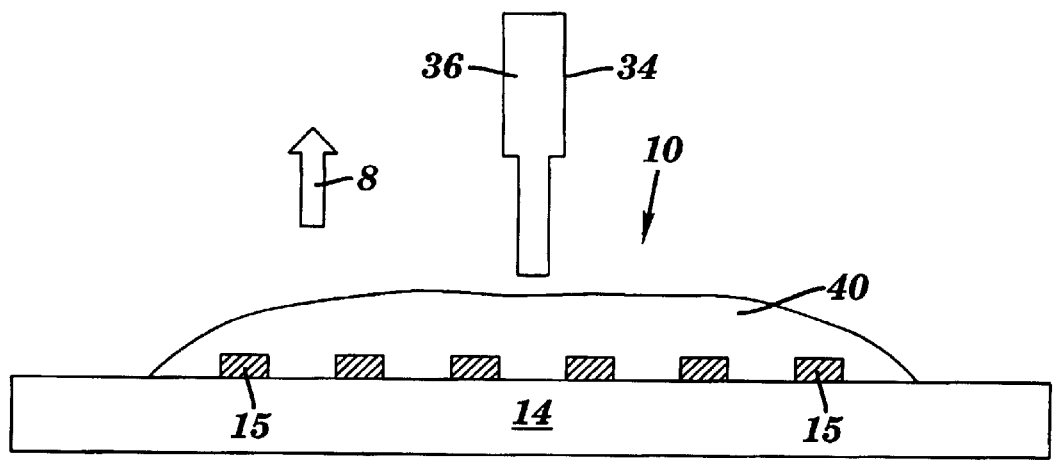
FIG. 5 depicts an initial step in forming the electronic structure of FIG. 1 by the no-flow method, in accordance with embodiments of the present invention, wherein the electronic structure includes a substrate having conductive pads, and wherein underfill material is being dispensed on the substrate.

FIG. 5 illustrates an initial step in forming the electronic structure 10 of FIG. 1 by the no-flow method, in accordance with embodiments of the present invention. The electronic structure 10 in the initial step of FIG. 5 includes the substrate 14, previously discussed supra in conjunction with FIG. 1. The substrate 14 has the attached conductive pads 15. Also shown in FIG. 5 is the tube 34 with a plunger such that the tube 34 dispenses underfill material 36 on the substrate 14. The tube 34 is positioned over the conductive pads 15. The underfill material 36 in the tube 34 becomes an underfill 40 after being so dispensed. The underfill 40 covers the conductive pads 15. The underfill material 36 includes a mixture of resin and filler, which subsequently becomes the resin 22 and filler 24, respectively, of FIG. 1. The resin and filler may include any resin and filler, respectively that has been described supra in conjunction with FIG. 1. While in the tube 34, the resin and filler are pressurized and distributed approximately homogeneously as discussed supra in conjunction with FIG. 4.

The substrate 14 may be heated prior to dispensing the underfill 40. If the substrate 14 is sufficiently heated prior to dispensing the underfill 40, then the resin 22 will receive heat from the substrate 14, and the viscosity of the resin 22 will be consequently lowered to an extent that allows movement of filler 24 particles through the resin 22 with an upward component in a direction 8 as explained infra in conjunction with FIG. 7. Heating of the substrate 14 should be to a sufficient temperature for lowering the viscosity of the resin 22 such that the filler 24 particles are able to move through the resin 22. The sufficient temperature is a function of both the resin 22 and the filler 24 and may be in a range, inter alia, from about 50° C. to about 110° C.

Figure 6:
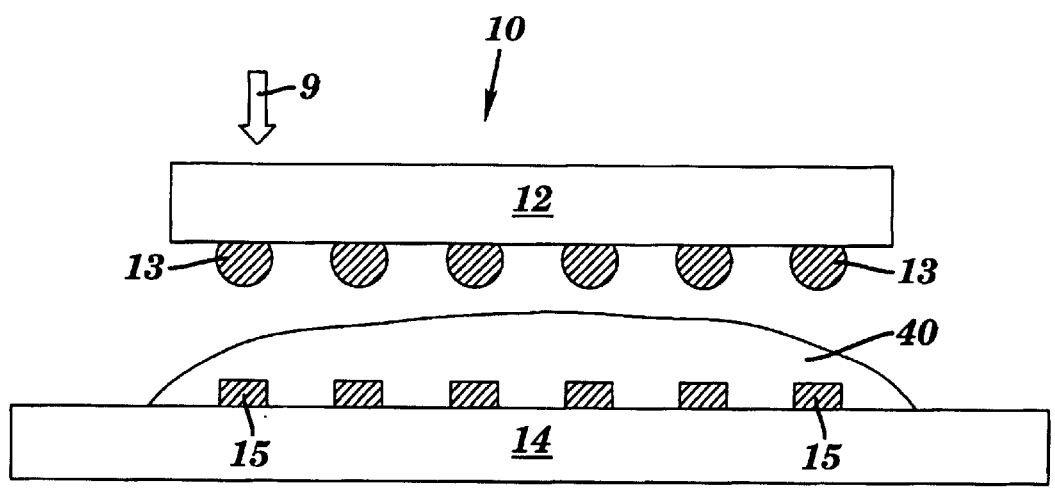
FIG. 6 depicts FIG. 5 with an electronic device over the underfill material, wherein the electronic device is moving toward the underfill material and toward the substrate.

FIG. 6 illustrates FIG. 5 with the electronic device 12 over the underfill material 40. Solder members 13 (e.g., C4 solder balls) are coupled to the electronic device 12. The solder members 13 of the electronic device 12 are aligned over corresponding conductive pads 15 of the substrate 14. The electronic device 12 is being moved in a direction 9 toward the substrate 14 and also toward the underfill 40 material for subsequent motion into the underfill 40 material, and for subsequent placement of the solder members 13 proximate to the corresponding conductive pads 15. After subsequent curing to be described infra, the underfill 40 material of FIG. 6 will become the underfill 26 of FIG. 1.

Figure 7:
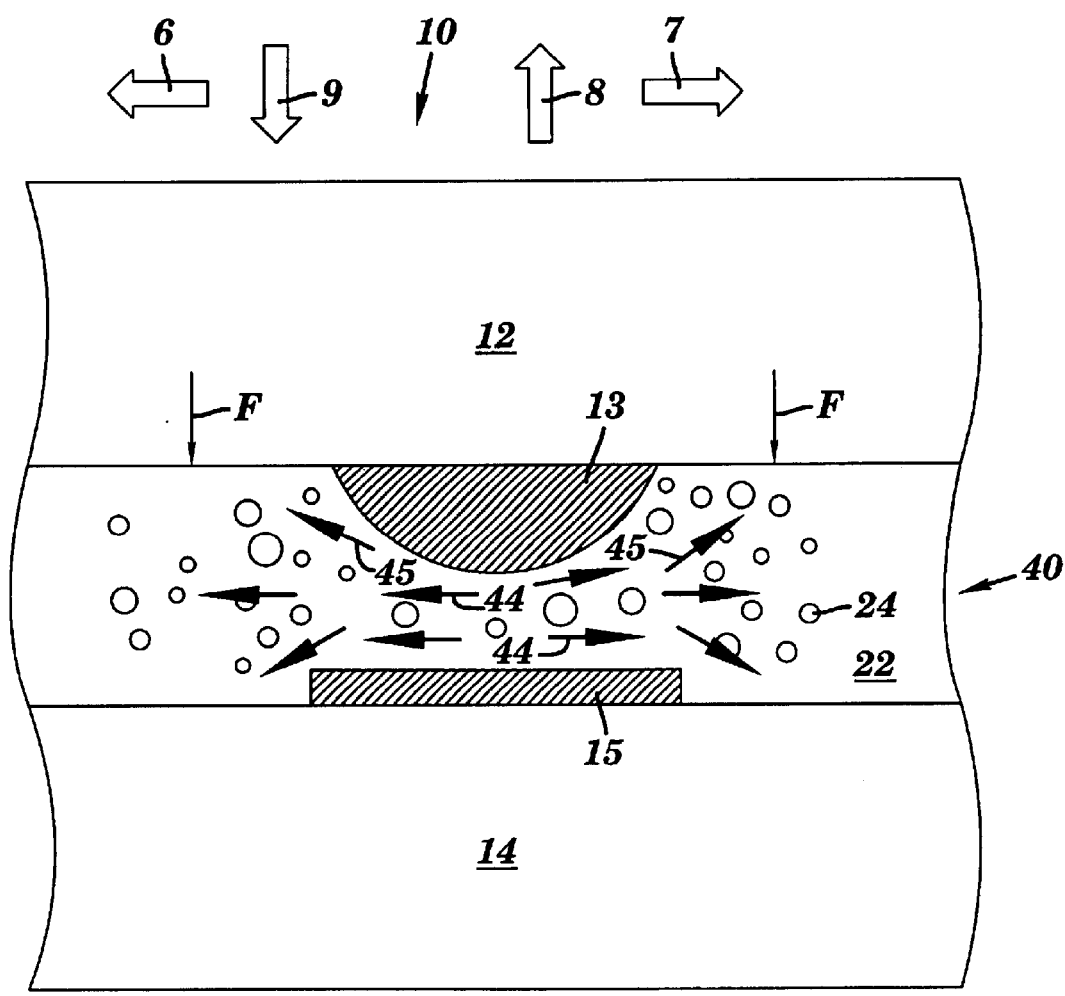
FIG. 7 depicts FIG. 6 with the electronic device in contact with the underfill material, and with the electronic device still moving toward the substrate.

FIG. 7 illustrates FIG. 6 with the electronic device 12 in contact with the underfill 40 material, and with the electronic device 12 still moving toward the substrate 14 until the solder members 13 are proximate the corresponding conductive pads 15. The underfill 40 material comprises the resin 22 and the filler 24. As the electronic device 12 moves in the direction 9 toward the underfill 40 material, the electronic device 12 imparts a force F, in the direction 9, on the underfill 40 material between the solder members 13 and the corresponding conductive pads 15. A gravitational force on the filler 24 particles is in the direction 9. The force F upon the underfill 40 material, in light of the low density of the filler 24 relative to the density of the resin 22, "squeezes" the resin 22 and the filler 24 particles such that the resin 22 material and filler 24 particles move in directions 6 and 7 away from the space between the solder members 13 and the corresponding conductive pads 15. More particularly, the resin 22 moves in the directions 44 shown in FIG. 7 and the moving resin 22 carries the filler 24 particles away from the space between the solder members 13 and the corresponding conductive pads 15. In addition, the filler 24 particles move in directions 45 which have an upward component in the direction 8. The upward component of filler 24 particle motion, in light of the direction 9 of a gravitational force on the filler 24 particles, is due to the lower density of the filler 24 relative to the density of the resin 22. Such movement by the filler 24 particles establishes the distribution of filler 24 particles that is shown in FIG. 1.

After the electronic device 12 is placed on the underfill material 40 as shown in FIG. 7, the electronic structure 10 is heated (e.g., in a solder reflow oven) to a temperature of at least a solder melting temperature of the solder that joins the electronic device 12 to the conductive pads 15. After the solder reflow, the electronic structure 10 has the structure shown in FIG. 1. The heating solders the solder members 13 of the electronic device 12 to the corresponding conductive pads 15. Any method known to one of ordinary skill in the art may be used to effectuate the soldering, such as use of solder paste that melts and reflows due to the heating. The heating also cures the underfill material 40 (see FIG. 6) such that the underfill material 40 becomes the underfill 26 of FIG. 1. At an initial stage of the heating, the viscosity of the resin 22 decreases, which makes the resin 22 more liquid and thus permits the filler 24 particles to move more easily through the resin 22 in the directions 44 and 45. Also as explained supra in conjunction with FIG. 5, the substrate 14 may be heated prior to dispensing the underfill 40. If the substrate 14 is sufficiently heated prior to dispensing the underfill 40, then the resin 22 will receive heat from the substrate 14 after being so dispensed, and the viscosity of the resin 22 will be consequently lowered to an extent that allows movement of filler 24 through the resin 22, which supplements the ability of the aforementioned heating during solder reflow to cause the filler 24 to move through the resin 22.

FIG. 1, described supra, illustrates FIG. 7 after the heating process has soldered the solder members 13 of the electronic device 12 to the corresponding conductive pads 15, and after the underfill material 40 has been cured and becomes the underfill 26. Another method that could be used for curing the underfill material 40 comprises exposing the underfill material 40 to radiation such as ultraviolet radiation. Although the underfill material 36 is homogeneous when dispensed from the tube 34 in FIG. 5, the underfill 26 of FIG. 1 shows the filler particles having a substantially higher concentration in the upper portion 30 of the underfill 26 than in the lower portion 31 of the underfill 26, because the low density of the filler 24 relative to the density of the resin 22 causes the filler 24 particles to move upward in the direction 8. As stated supra, the heating associated with the curing of the underfill lowers the viscosity of the resin 22, which allows the filler 24 particles to move more easily through the resin 22 in the upward motion of the filler 24 particles. In FIG. 1, the solder portion of the interconnect 16 is predominantly in the upper portion 30 of the underfill 26 inasmuch as the solder portion is derived from the solder member 13 (see FIG. 6). Thus in FIG. 1, the higher concentration of the filler 24 particles in the upper portion 30 is where the solder portion is predominantly located, which enables the resulting lower CTE in the upper portion 30 to be matched with the CTE of the solder portions so as to protect the structural integrity of interconnects 16 during thermal cycling operations. Additionally, the lower CTE in the upper portion 30 reduces the CTE mismatch between the underfill 26 and the electronic device 12.

The filler 24 particles of the present invention lowers the CTE of the underfill 26 to a value that is closer to the CTE of the electrically conductive interconnects 16, which helps protect the structural integrity of the electrically conductive interconnects 16. Additionally, the filler 24 material is typically stiffer than that of the resin 22 material. Thus, adding the filler 24 to the resin 22 increases the elastic modulus of the underfill 26 relative to using only the resin 22 for the underfill 26, which further protects the electrically conductive interconnects 16 during thermal transients.

Tests were conducted in accordance with the no-flow embodiment of the present invention. A filler homogeneously distributed within a resin was used as the underfill material 36 of FIG. 5, and the electronic structure 10 of FIG. 1 was formed as described supra in conjunction with FIGS. 5–7. The filler comprised a borosilicate glass. The resin comprised an epoxy resin, an anhydride hardener, and metal chelate catalyst. The underfill 26 of FIG. 1 was cured by being heated at about 150° C. for about 90 minutes.

Figure 8:
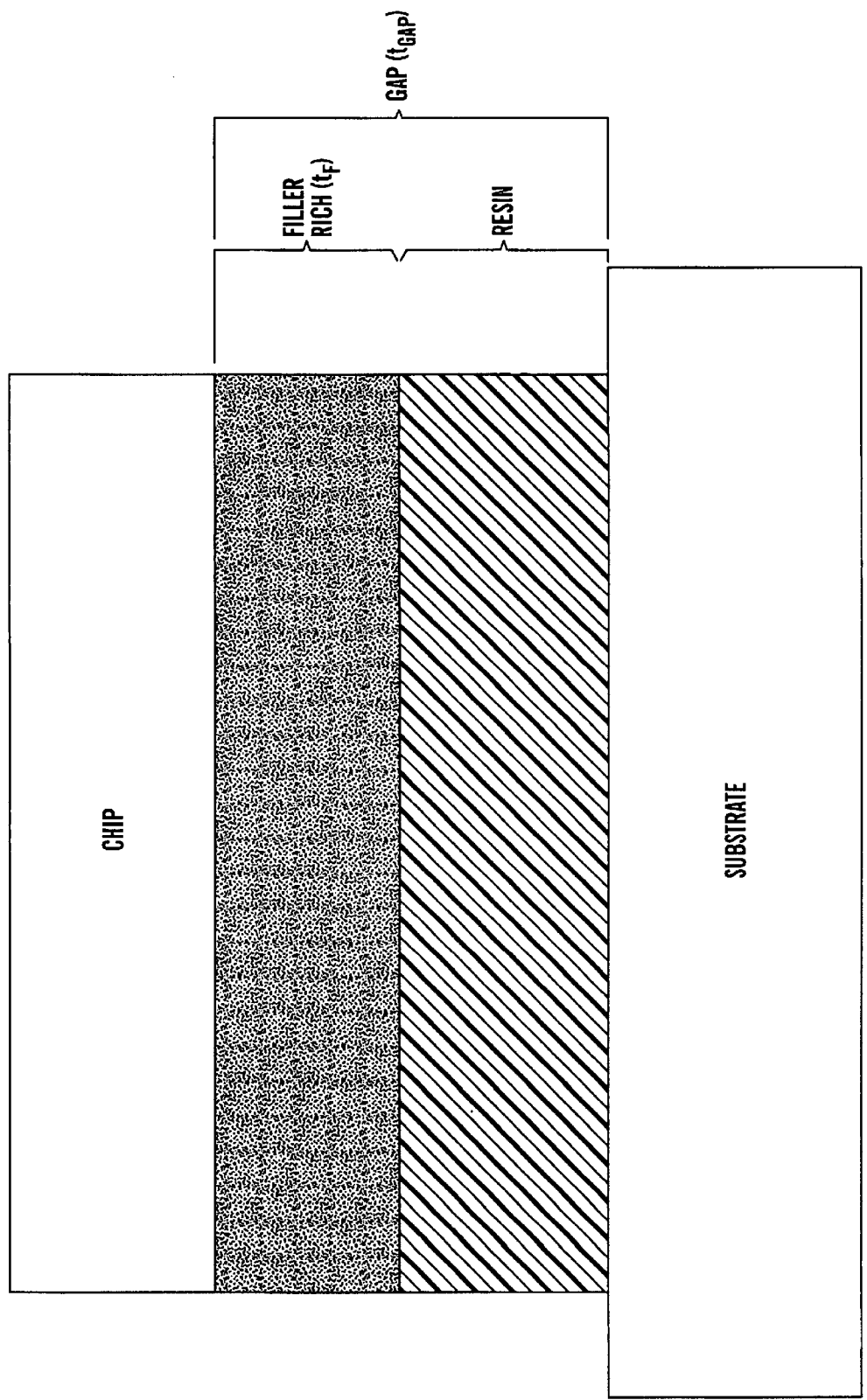
FIG. 8 depicts a test sample associated with the no-flow embodiment of FIGS. 5–7.

FIG. 8 shows a sample obtained following completion of the test, the sample comprising a chip and a substrate with underfill therebetween in a gap having a thickness $t_{GAP}$. The gap is the space between the chip and the substrate shown in FIG. 8. The filler-rich region had a thickness denoted as $t_F$. The test varied the weight percent composition of the filler ($W_F$) within the initial underfill material; i.e., the percent composition of the filler in the underfill 36 of FIG. 5. The test measured the percent of the gap ($G_F$) occupied by the filler-rich region of FIG. 8. $G_F$ is calculated as $100\, t_F/t_{GAP}$. The CTE of the resin is known to be about 70 ppm/° C.

Figure 9:
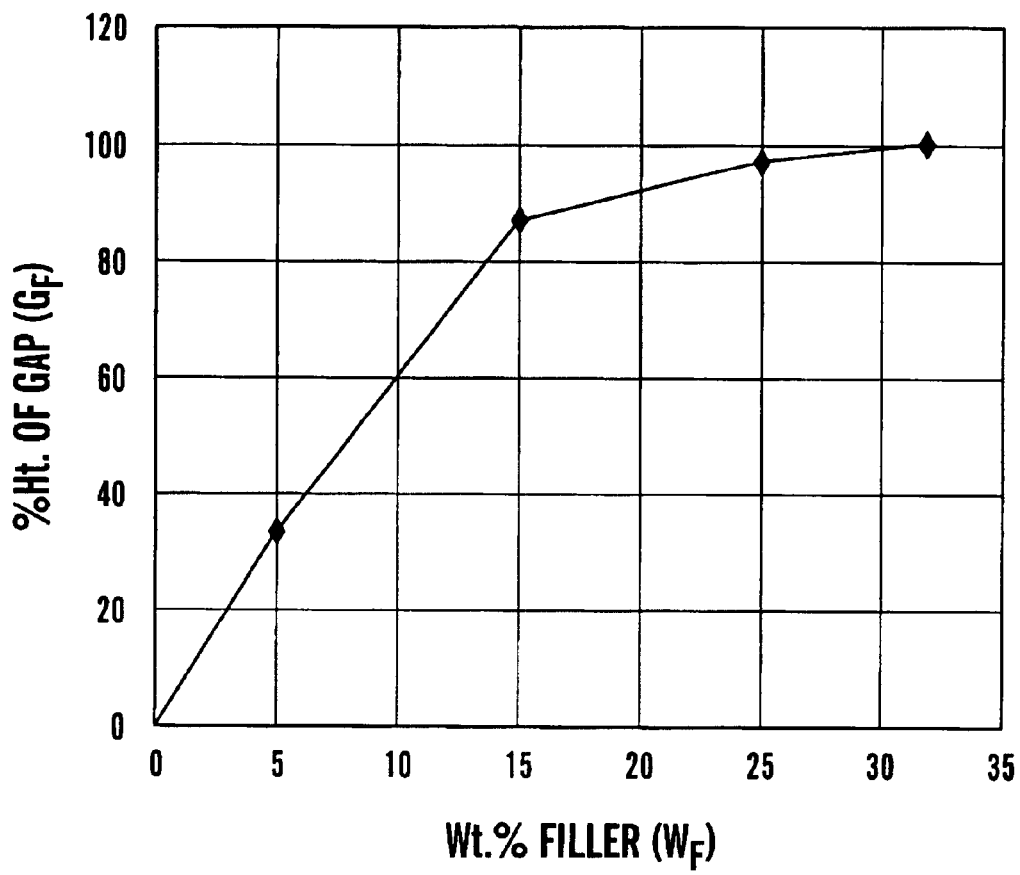
FIG. 9 is a plot of results of the test of FIG. 8, said plot showing percent of total space occupied by a filler-rich material versus weight percent concentration of filler within the underfill material.

FIG. 9 is a plot of $G_F$ versus $W_F$. Five data points are indicated in FIG. 9, corresponding to $W_F$ values of 0, 5, 15, 25, and 32. FIG. 9 shows that $G_F$ varies nonlinearly with $W_F$. $G_F$ exceeds about 87% if $W_F$ is at least 15%, $G_F$ is between 60% and about 87% if $W_F$ is between 10% and 15%, and $G_F$ is 100% if $W_F$ is 30% and above. Thus only a small value of $W_F$ is required to cover most or all of the surface of the electrically conductive interconnect 16 of FIG. 1 with the filler-rich material. This is a desirable result since the electrically conductive interconnect 16 of FIG. 1 should be maximally covered by the filler-rich material in order to be maximally protected against damage induced by shear stress resulting from a CTE mismatch between the electrically conductive interconnect 16 and the adjacent underfill material. The CTE of the filler-rich material was measured to be about 40 ppm/° C. for every sample and is thus independent of $W_F$. The CTE of the filler-rich material of about 40 ppm/° C. represents a substantial improvement over the CTE of about 70 ppm/° C. of the resin. The CTE of the filler-rich material of about 40 ppm/° C. is within the useful range of about 20 ppm/° C. to about 50 ppm/° C. when the CTE of the solder portions of the interconnects 16 is about of about 28 ppm/° C. More generally, a useful range of the CTE of the filler-rich material is about −8 ppm/° C. to about +22 ppm/° C. relative to the CTE of the solder portions of the interconnects 16. As to $W_F$, the test shows that $W_F$ should be between about 5% and about 15% to provide adequate or good CTE protection of the electrically conductive interconnect 16, and between about 15% and about 30% to provide very good CTE protection. CTE protection is maximal (i.e., $G_F=100\%$) if $W_F$ is about 30% or higher.

Thus, CTE protection does not materially improve as $W_F$ increases above about 30%.

In summary, having the filler 24 within the upper portion 30 of the underfill 26 results in a filler-rich underfill material in contact with both the electrically conductive interconnect 16 and the electronic device (e.g., chip) 12. With the filler-rich underfill material having a CTE that is substantially closer to the CTE of the both the electrically conductive interconnect 16 and the electronic device 12 as compared with the CTE of the underfill resin 22, the present invention mitigates both tensile stresses and shear stresses that would otherwise threaten the structural integrity of the electrically conductive interconnect 16 during thermal transients (e.g., during thermal cycling). In addition, the filler 24 material is typically stiffer than that of the resin 22 material, so that adding the filler 24 to the resin 22 increases the elastic modulus of the underfill 26 relative to using only the resin 22 for the underfill 26, which further protects the electrically conductive interconnects 16 during thermal transients.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

I claim:

1. An electronic structure, comprising:

a substrate;

an electronic device coupled to the substrate by an electrically conductive interconnect; and an underfill disposed in a space between the electronic device and the substrate, wherein an upper portion of the underfill is adjacent to the electronic device, wherein a lower portion of the underfill is adjacent to the substrate, wherein the underfill encapsulates the electrically conductive interconnect, wherein the underfill comprises a resin and a filler, wherein the density of the filler is less than the density of the resin, and wherein the weight percent concentration of the filler in the underfill is higher in the upper portion of the underfill than in the lower portion of the underfill.

2. The electronic structure of claim 1, wherein the lower portion of the underfill is essentially free of the filler.

3. The electronic structure of claim 1, wherein the filler includes a hollow sphere particle.

4. The electronic structure of claim 1, wherein the filler includes borosilicate glass.

5. The electronic structure of claim 1, wherein the filler includes alumina or silica.

6. The electronic structure of claim 1, wherein the filler includes particles each having a dimension that does not exceed a distance between the electronic device and the substrate.

7. The electronic structure of claim 1, wherein a coefficient of thermal expansion (CTE) of the upper portion of the underfill is within about −8 ppm/° C. to about +22 ppm/° C. relative the CTE of a solder portion of the electrically conductive interconnect.

8. The electronic structure of claim 1, wherein a coefficient of thermal expansion (CTE) of the upper portion of the underfill is between about 20 ppm/° C. and about 50 ppm/° C.

9. The electronic structure of claim 1, wherein an average weight percent of the filler within the underfill is between about 5% and about 30%.

10. The electronic structure of claim 1, wherein the electronic device includes a semiconductor chip.

11. The electronic structure of claim 10, wherein the substrate includes a chip carrier.

* * * * *